United States Patent
Satya et al.

(10) Patent No.: US 6,813,572 B2
(45) Date of Patent: Nov. 2, 2004

(54) APPARATUS AND METHODS FOR MANAGING RELIABILITY OF SEMICONDUCTOR DEVICES

(75) Inventors: Akella V.S. Satya, Milpitas, CA (US); Li Song, Fremont, CA (US); Robert Thomas Long, Santa Cruz, CA (US); Kurt H. Weiner, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/281,432

(22) Filed: Oct. 24, 2002

(65) Prior Publication Data

US 2003/0097228 A1 May 22, 2003

Related U.S. Application Data

(60) Provisional application No. 60/346,074, filed on Oct. 25, 2001.

(51) Int. Cl.[7] .............................................. G06F 19/00
(52) U.S. Cl. ...................................................... 702/82
(58) Field of Search ...................... 702/82, 118; 257/48, 257/203; 307/149; 386/125; 340/435; 701/66; 342/77; 236/12; 361/24, 71; 324/760, 765; 714/718; 123/396; 427/11

(56) References Cited

U.S. PATENT DOCUMENTS

| | | | |
|---|---|---|---|
| 5,986,281 A | * 11/1999 | Burchanowski et al. | 257/48 |
| 6,175,812 B1 | * 1/2001 | Boyington et al. | 702/118 |
| 6,483,334 B1 | * 11/2002 | Hsieh | 324/760 |
| 6,574,760 B1 | * 6/2003 | Mydill | 714/724 |

* cited by examiner

Primary Examiner—John Barlow
Assistant Examiner—Tung S Lau
(74) Attorney, Agent, or Firm—Beyer, Weaver & Thomas, LLP.; Mary Ramos Olynick, Esq.

(57) ABSTRACT

Disclosed are methods and apparatus for determining whether to perform burn-in on a semiconductor product, such as a product wafer or product wafer lot. In general terms, test structures on the semiconductor product are inspected to extract yield information, such as defect densities. Since this yield information is related to the early or extrinsic instantaneous failure rate, one may then determine the instantaneous extrinsic failure rate for one or more failure mechanisms, such as electromigration, gate oxide breakdown, or hot carrier injection, based on this yield information. It is then determined whether to perform burn-in on the semiconductor product based on the determined instantaneous failure rate.

16 Claims, 9 Drawing Sheets

APPARATUS AND METHODS FOR MANAGING RELIABILITY OF SEMICONDUCTOR DEVICES

CROSS-REFERENCE TO RELATED APPLICATION

This application takes priority under U.S.C. 119(e) of U.S. Provisional Application No. 60/346,074 by Akella V. S Satya et al., filed Oct. 25, 2001, entitled "FULL-FLOW INTEGRATED-IC YIELD AND RELIABILITY TEST SITE." This application is incorporated herein by reference in its entirety for all purposes.

BACKGROUND

The field of the invention relates to the fabrication of semiconductor devices and the resulting yield and reliability of fabricated semiconductor devices. More particularly, it relates to techniques for increasing the post-fabrication reliability of semiconductor wafers and devices disposed thereon.

The reliability of a semiconductor product can be described by a universal bathtub curve (FIG. 1), which plots the instantaneous failure rate as a function of time. The instantaneous failure rate may be generally defined as the ratio of (number of failures in dt)/dt and the population at time t. There are three parts in the universal curve. The first part is the rapid drop of instantaneous failure rate, which is called the extrinsic or early failure rate (EFR) or infant mortality rate of the chips when in machine use, mainly due to partial or latent electrical-defects. After the instantaneous failure rate drops, it reaches a steady state. Eventually the instantaneous failure rate increases, due to the intrinsic failure rate (IFR).

Early failure rate (EFR) of a particular semiconductor device depends on both the material properties and reliability (partial or latent) defect densities, and early failure typically happens within the first few months of operation under machine use conditions. Reliability defects are generally small partial defects that test good (i.e., do not result in faults) at the end of processing, $t_0$, but cause early fails or infant mortality soon after introduction into the field service. Major reliability issues include interconnect electromigration, gate oxide breakdown, and hot carrier injection. For example, a partial open will reduce the line width in an interconnect, although the interconnect is still electrically connected. Current crowding and local heating in the interconnect with partial defects will promote accelerated electromigration and eventually cause voiding, that opens the line. These defects are called reliability or latent defects.

Since most microelectronics components have an infant mortality period of up to one year under ordinary operating conditions, the reliability problem in the infant mortality period becomes extremely important. Product is usually burnt-in to eliminate early failures in a short period of time (days) at accelerated stress conditions (high voltage and high temperature).

Burn-in of the integrated circuit (IC) modules eliminates the early fails or infant mortality devices, which are a major concern of semiconductor manufacturer as well as the Circuit Design groups or Fabless Companies. The burn-in test that subjects devices to higher than usual levels of stress, such as voltage and temperature, is a technique used to remove the chips with latent defects. One purpose for applying burn-in to IC products is to guarantee high reliability of the end products, by weeding out products that are susceptible to infant mortality from commercial application. However, the burn-in process tends to be very expensive. Applying accelerated stress conditions such as voltage, temperature, and the post-burn-in retest are associated with significant costs. Currently, burn-in costs around 5 billion dollars annually worldwide.

Accordingly, there is a need for efficiently and accurately predicting the early failure rates associated with IC products. That is, there is a need for cost-effective techniques for identifying IC product lots which are susceptible to infant mortality, so that the cost of Burn-In can be drastically reduced.

SUMMARY OF THE INVENTION

Accordingly, techniques and systems are provided for determining whether to perform burn-in on a semiconductor product, such as a product wafer or product wafer lot. In general terms, test structures on the semiconductor product are inspected to extract yield information, such as defect densities. Since this yield information is related to the early or extrinsic instantaneous failure rate, one may then determine the instantaneous extrinsic failure rate for one or more failure mechanisms, such as electromigration, gate oxide breakdown, or hot carrier injection, based on this yield information. It is then determined whether to perform burn-in on the semiconductor product based on the determined instantaneous failure rate.

In one embodiment, a method of determining whether to perform burn-in on a semiconductor product is disclosed. For the semiconductor product, a time to fail for one or more failure mechanisms is determined. For the semiconductor product, an instantaneous failure rate for the one or more failure mechanisms is also determined based on the determined time to fail for the one or more failure mechanisms and yield information obtained from the semiconductor product. A burn-in procedure is invoked on the semiconductor product when the determined instantaneous failure rate for such semiconductor product is not within a predetermined specification bound. In contrast, the burn-in procedure is skipped when the determined instantaneous failure rate for such semiconductor product is within the predetermined specification.

In a specific implementation, the determination of the instantaneous failure rate is based indirectly on the yield information and such determination includes (1) for the semiconductor product, determining the critical areas of the design data for each reliability early-failure mode, (2) inspecting one or more test structures on the semiconductor product to determine yield information (defect density, etc.,) for the semiconductor product lot immediately after the corresponding fabrication-process, (3) determining a reliability fault density for reliability defects in the semiconductor product based on the determined yield information and the determined critical area for reliability failure, and (4) for the semiconductor product, determining an instantaneous failure rate for the one or more failure mechanisms based on the determined time to failure for the one or more failure mechanisms.

In a further aspect, determining the critical area for reliability failure includes (1) determining a probability of failure function for yield of the semiconductor product, (2) providing a defect size distribution for the semiconductor product, (3) determining the critical area for yield for the semiconductor product based on the determined probability of failure function for yield and the defect size distribution for the semiconductor product, (4) determining a probability of failure function for yield plus reliability, (5) determining a critical area for yield plus reliability from the probability of failure function for yield-plus-reliability, and (6) determining the critical area for reliability by subtracting the critical area for yield from the critical area for yield plus reliability. In yet a further aspect, the determination of the probability of fail function for yield plus reliability comprises shifting the probability of fail curve for yield as a function of defect size to a minimum reliability defect size that will cause a reliability fault, but still testing good for yield.

In a specific embodiment, inspecting one or more test structures on the semiconductor product to determine yield information for the semiconductor product lot immediately after fabrication includes (1) inspecting the one or more test structures to determine test structure yield, (2) determining a log of test structure yield as a function of a size of the one or more test structures, and (3) determining a defect density, systematic yield, and alpha-curvature or the defect cluster parameter from the log of test structure yield as a function of the size.

In another aspect, the invention pertains to a computer program product for determining whether to perform burn-in on such semiconductor product. The computer program product includes at least one computer readable medium and computer program instructions stored within the at least one computer readable product operable to perform one or more of the above described methods.

In another embodiment, the invention pertains to a computer system for determining whether to perform burn-in on such semiconductor product. The computer system includes a processor and/or at least one memory operable to (1) for the semiconductor product, determine a time to fail for one or more failure mechanisms, (2) for the semiconductor product, determine an instantaneous failure rate for the one or more failure mechanisms based on the determined time to fail for the one or more failure mechanisms and yield information provided from inspection of such semiconductor product, (3) determine to perform a burn-in procedure on the semiconductor product when the determined instantaneous failure rate for such semiconductor product is not within a predetermined specification bound, and (4) determine to skip the burn-in procedure when the determined instantaneous failure rate for such semiconductor product is within the predetermined specification bound.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 2:
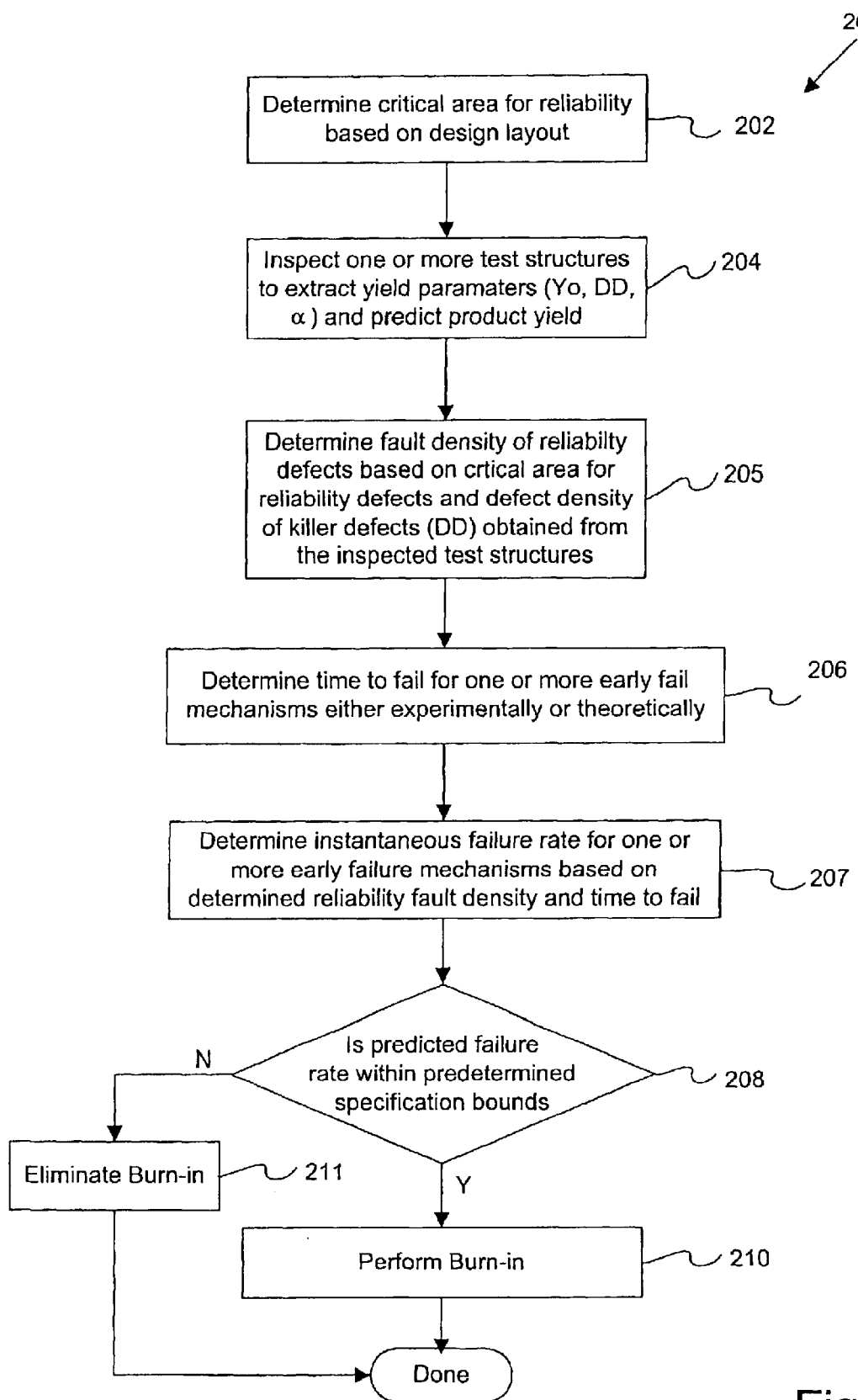
FIG. 2 is a flowchart illustrating a procedure for determining whether to perform burn-in in accordance with one embodiment of the present invention.

FIG. 2 is a flowchart illustrating a procedure 200 for determining whether to perform burn-in on a particular product wafer lot susceptible to random defects in accordance with one embodiment of the present invention. The following procedure may be easily modified to determine whether to perform burn-in for any suitable set of semiconductor devices, such as the devices on a product wafer or a plurality of product wafer lots fabricated with the same process or within the same time period. For example, the wafer lots fabricated within a same time period, such as a 6 month time period, may be analyzed to determine whether burn-in should be performed on such set of wafer lots.

Initially in the illustrated embodiment, the critical area for reliability is determined in operation 202. Critical area refers to the fractional area of the layout, in which if a latent defect occurs, it would cause an early failure, due to an early failure mechanism such as electromigration. One example technique for determining the reliability critical area is described further below with reference to FIG. 3. One or more test structures are then inspected to identify killer defects, such as shorts and opens in operation 204. The killer defect information is then used to extract yield parameters, such as systematic yield, defect density, and a defect clustering factor, and to predict product yield in operation 204. Techniques for extracting yield parameters and predicting product yield are described further below. The fault density for the reliability defects is determined based on the determined reliability critical area and defect density of killer defects obtained from the inspected test structures in operation 205.

In one implementation, the reliability fault density is equal to the product of the reliability critical area and defect density of killer defects and may be used to determine how many chips would be vulnerable to infant mortality.

The time to fail for one or more failure mechanisms (e.g., electromigration) may then be determined in operation 206. The time to fail may be determined experimentally or theoretically based on the particular material characteristics and stress conditions. In the theoretical case, the time to fail equation varies with the failure mechanism. That is, the time to fail equation for failure due to electromigration differs from the time to fail equation due to hot carrier injection. Thus, in a theoretical approach one selects the time to fail equation that is appropriate for the particular failure mechanism, such as electromigration.

In an experimental approach, specialty reliability test structures may be fabricated to determine time to fail for a particular failure mechanism, such as electromigration. For example, a particular stressing current may be run through a set of conductive lines, at a set of stressing temperatures, having particular dimensions and a particular latent defect, until electromigration failures occur for validation of the time to fail prediction model. Other types of test structures may be utilized to determined time to fail for other failure mechanisms, such as hot carrier injection and gate oxide breakdown, for example, which reliability test structures are well known to those skilled in the art.

After the time to fail for one or more failure mechanisms is determined, the instantaneous failure rate for one or more early failure mechanisms may be determined in operation 207. The instantaneous failure rate is generally determined from the reliability fault density and time to fail. Example techniques for determining the instantaneous failure rate are described further below. It is then determined whether the instantaneous failure rate is within a predetermined specification in operation 208. For instance, it may be determined whether the instantaneous failure rate is above a predetermined rate as in the case of an excursion-lot. If the instantaneous failure rate is within a predetermined specification, burn-in is then eliminated in operation 211. Thus, if the predicted instantaneous failure rate is within a predetermined specification bound, then the burn-in step may be skipped for cost savings. Otherwise, when the instantaneous failure rate is not within the specification bounds, burn-in is performed in operation 210. In a specific example, burn-in may be performed for instantaneous failure rates exceeding a $3\sigma$ bound with respect to an average rate. For instance, a running average rate may be kept as each wafer lot is processed.

Figure 3:
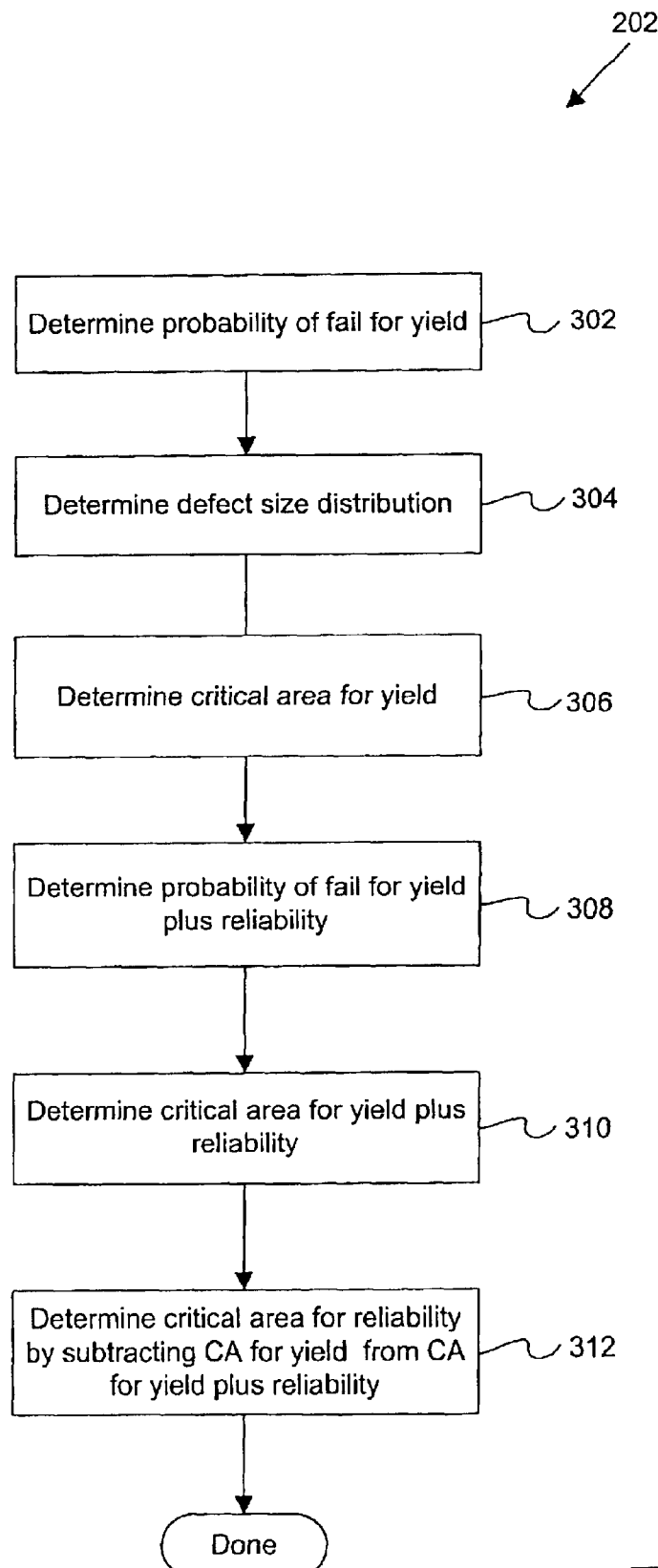
FIG. 3 is a flowchart illustrating the operation of FIG. 2 for determining the critical area for the reliability in accordance with one embodiment of the present invention.

FIG. 3 is a flowchart illustrating the operation 202 of FIG. 2 for determining the critical area for the reliability in accordance with one embodiment of the present invention. This technique will be described in conjunction with the graph illustrated in FIG. 4. Initially, the probability of fail curve for yield (402 of FIG. 4) is determined in operation 302. The defect size distribution (404 of FIG. 4) is then determined in operation 304. Any suitable techniques for determining the probability of fail and defect size distribution (DSD) curves may be utilized, and several techniques for determining the probability of fail and DSD curves are described or cross-referenced further below.

The critical area for yield (406 of FIG. 4) is then determined in operation 306. The critical area for yield is obtained by integrating the convolution of the probability of fail for yield curve with the DSD curve as described further below with respect to FIGS. 5A and 5B.

Figure 4:
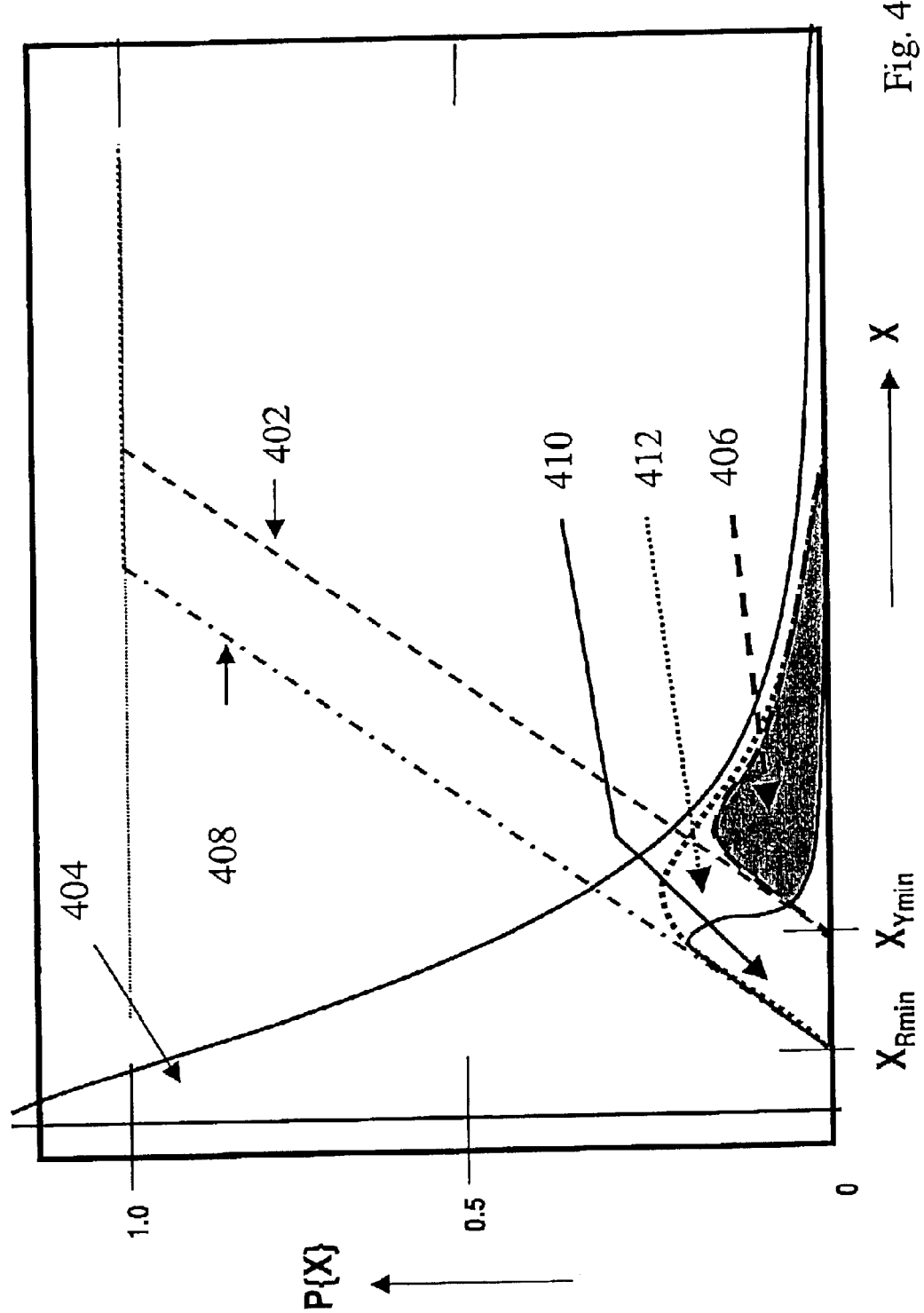
FIG. 4 illustrates a graph of the determined probability of fail for yield, the defect size distribution, and the determined critical area for yield as a function of defect size.

The probability of fail for yield plus reliability may then be determined in operation 308. As shown in FIG. 4, the probability of fail for reliability and yield 408 may be determined by shifting the probability of fail for yield curve 402 to a minimum defect size Xrmin [$>X_0$] that would result in a reliability fault, defined for example as a partial open with remaining line width of Xymin-Xrmin. The critical area for yield plus reliability 410 may then be determined by convoluting the probability of fail for reliability and yield curve 408 with the defect size distribution curve 404, assuming the same defect size distribution applies for both cases. The critical area for reliability may then be determined by subtracting the critical area for yield curve 406 from the critical area for yield plus reliability curve 410 in operation 312. Thus, the critical area for reliability curve 412 is obtained as shown in FIG. 4. As Xrmin decreases, the line remaining width increases, and the probability of a defect causing such remaining line width increases. However while the remaining line width increases, the contribution of the partial defect to early failure decreases.

Figure 5A:
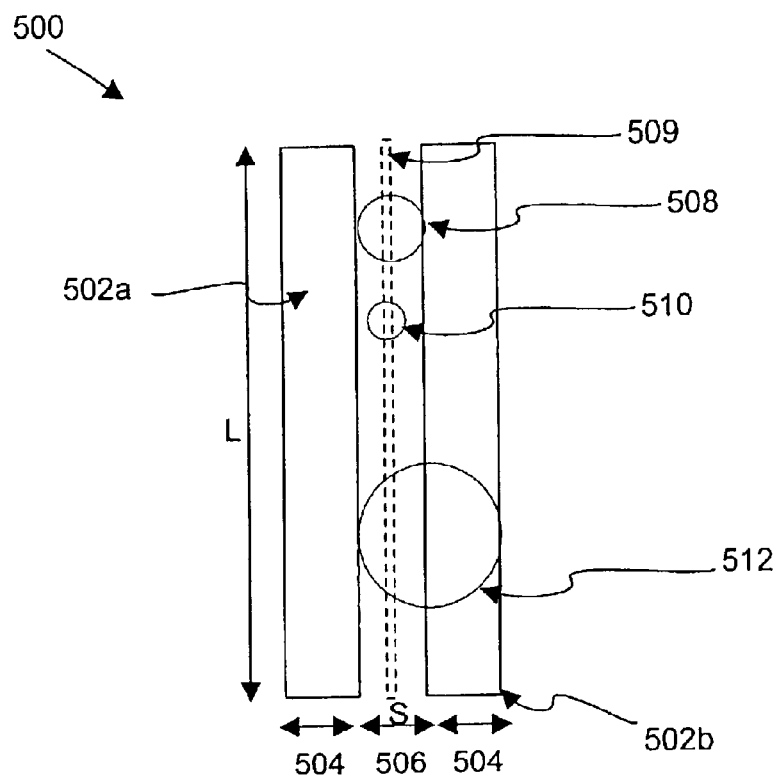
FIG. 5A is a diagrammatic top view of a simple test structure having two conductive lines.
Figure 5B:
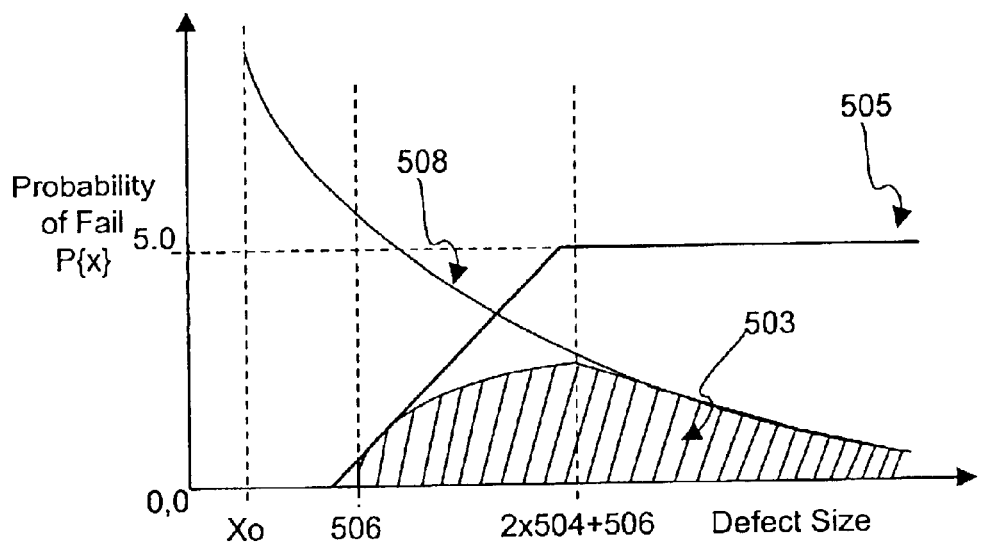
FIG. 5B is a graph of the Probability of Fail, the Defect Size Distribution function, and the critical area as a function of defect size for the test structure of FIG. 5A.

Any suitable technique may be implemented for determining the probability of fail for yield and the critical area for yield (which will be used to determine the reliability critical area). Critical area for yield refers to the fractional area of the layout, in which if a defect occurs, it would cause a fault (e.g., an electrical fail due to a short or an open). FIGS. 5A and 5B illustrate the concept of critical area. Each specific configuration of semiconductor circuit, pattern, and test structure has an associated critical area. Additionally, each specific circuit, pattern, and test structure has an associated probability of fail curve as a function of defect size. FIG. 5A is a diagrammatic top view of a simple test structure 500 having two conductive lines 502a and 502b. The lines 502a and 502b both have a width 504 and a spacing 506.

FIG. 5B is a graph showing the critical area 503, the probability of fail 505 and the defect-size distribution 507 [the area under which is normalized to unity between $X_0$ and $\infty$] as a function of defect size for the test structure 500 of FIG. 5A. A defect 510 that has a size less than the line spacing will not cause a fault (e.g., short) in any area of test structure 500. As shown in FIG. 5B, the probability of fail is zero for defects of sizes less than the line space 506. However, a defect 508 or defect 512 having a size (e.g., diameter) equal to or greater than the width 506 will have an associated probability for causing a fault. For example, if the center of the defect 508 is positioned in a narrow area 509 that runs down the centerline between the two lines 502, it will cause a fault by shorting the two lines 502.

The ratio of this narrow area 509 and the area of the window 500 is the probability of fail for defect 508. The probability of fail will continue to increase for increasingly sized defects until it equals unity at a particular defect size. For this test structure 500, the plateau at unity occurs at a defect size that is twice the line spacing 506 plus the line width 504. When this probability of fail curve 505 is convoluted with the defect-size distribution 507 and the result is integrated between the limits of $X_0$ and Xmax, a reasonably large maximum defect size much greater than [(2*506)+(504)], the critical area may be obtained.

One technique implements a closed-form solution for the determining the probability of fail curve for conductive line structures each having a width W, and separated by a distance S: The probability of fail for shorts in this simple layout is:

$$P\{X\}=0 \text{ for } X \leq (506)$$

$$P\{X\} = \frac{X-S}{W+S}$$

$P\{X\}=1$ for $X \geq [2*(506)+(504)]$;

and the Critical Area is:

$$CA = \int_{X_0}^{X_{max}} P\{X\} \cdot DSD \cdot dX$$

$$= (p-1)^{(p-1)} * X_0 \left[ \int_{X_0}^{2*S+W} \left( \frac{X-S}{W+S} \right) *(1/X^p) dX + \int_{2*S+W}^{X_{max}} 1/X^p \, dX \right]$$

However, this closed-form solution is only valid for parallel lines of one constant width and spacing, which is neither typical in any product, nor in a usual test structure layout.

One conventional technique for determining critical area is referred to as the "Quasi-Monte Carlo simulation." In this technique, random defects are simulated as being superimposed on a particular design data. These simulated defects initially have a particular diameter $x=W_{min}$. The number of faults produced by these defects having an initial diameter x is then determined. Defects having a diameter equal to $x+\Delta x$ are then simulated on the design data. The number of faults is then determined for defects having the diameter $x+\Delta x$. This simulation process iteratively repeats for larger sized defects until a maximum defect size of $X_{max}$ is reached. The probability of fail can then be determined from the number of faults and the total number of defects simulated at each incremental $\Delta x$ step. This iterative process is very time consuming, even for one defect mechanism (such as opens or shorts).

In another technique, each design structure is incrementally expanded until a short fault occurs when the two structures short together. The distance that the structure expanded is equal to the radius of the defect that can cause a fault. Similarly, for the case of the opens, the shapes are contracted by $\Delta x$ iteratively for determining the probability of fail curve [until $X_{max}$]. Other techniques perform a simulation on "sample" portions of the design data, rather than the entire design data. One example of a critical area determination software tool is EYES developed at the University of Edinburgh, England.

The critical area of a particular layout or test structure may alternatively be calculated directly from the layout features. That is, the critical area may be determined directly from the layout dimensions without iteratively changing the feature sizes or defect sizes. For example, a critical area for a particular layout design may be determined for a particular defect type and size based on the dimensions and positions of the individual layout features.

After the critical area for reliability is determined, any suitable number and type of test structures may be inspected to extract yield parameters and predict product yield for a particular defect type, such as shorts or opens. Optical and e-beam inspection tools such as the KLA Tencor 21xx and ES20 available from KLA-Tencor of San Jose, Calif. can be used to inspect both physical and electrical defects using, for example, voltage contrast type test structures. Several example voltage contrast test structures are described in U.S. Pat. No. 6,433,561, filed 25, Aug. 2000, which patent is incorporated herein by reference in its entirety.

Figure 6:
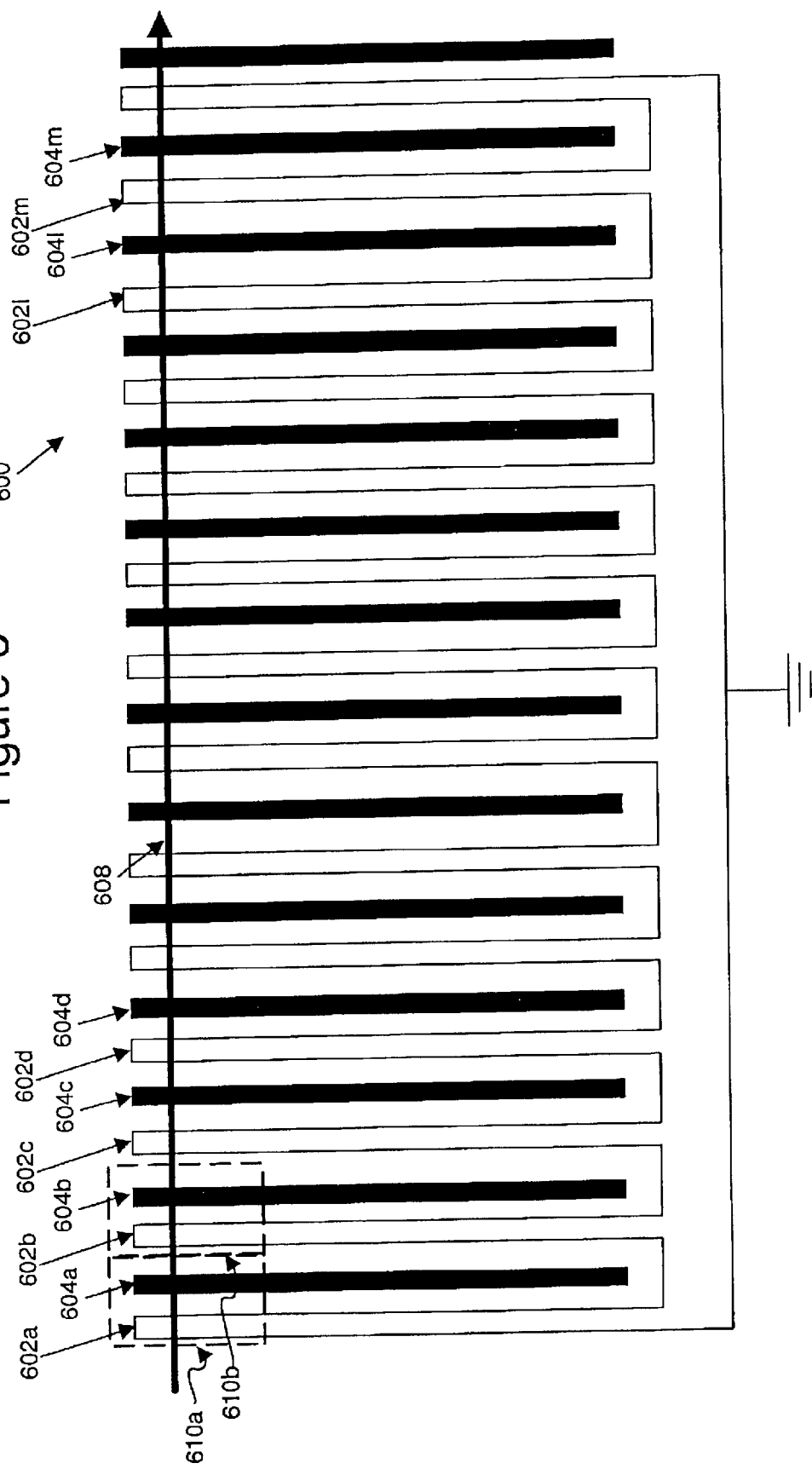
FIG. 6 is a diagrammatic top view representation of a test structure from which yield parameters and product yield may be obtained.

FIG. 6 is a diagrammatic top view representation of a voltage contrast test structure 600 from which yield parameters and product yield may be obtained. Test structure 600 is referred to as a comb-like structure. The inspection technique described below may be performed on a plurality of test structures similar to the test structure 600 of FIG. 6. Typically, a plurality of test structures are inspected on a product wafer to thereby predict the product yield.

In the illustrated embodiment, the test structure 600 includes a plurality of grounded conductive lines 602 and a plurality of floating conductive line 604. Voltage contrast images of a top portion of the conductive lines 602 and 604 are generated as an electron beam moves in direction 608. Each image (e.g., 610a and 610b) is referred herein to as an "image cell."

Preferably, the image cells correspond to feature portions that are designed to result in substantially identical images when no defects are present. In one embodiment, an image cell is generated for a top portion of each pair of grounded and floating lines. However, other portions of the features (e.g., a middle portion of the conductive lines) may be scanned. As shown, when the conductive lines are scanned in direction 608, cell 610a is first obtained and then cell 610b is obtained. Since the test structure 600 is expected to have alternating lines of grounded and floating potential, each image cell is expected to contain a bright line and a dark line. For example, the grounded lines 602 will appear bright, while the floating lines 604 will appear dark. Of course, the inspection tool may be set up so that the grounded lines 602 appear dark and the floating lines 604 appear bright. The specific intensity values of the conductive lines as the electron beam scans across them may also be ascertained to determine defects. When there are no defects, the intensity values are expected to include alternating high and low intensity values.

Figure 7:
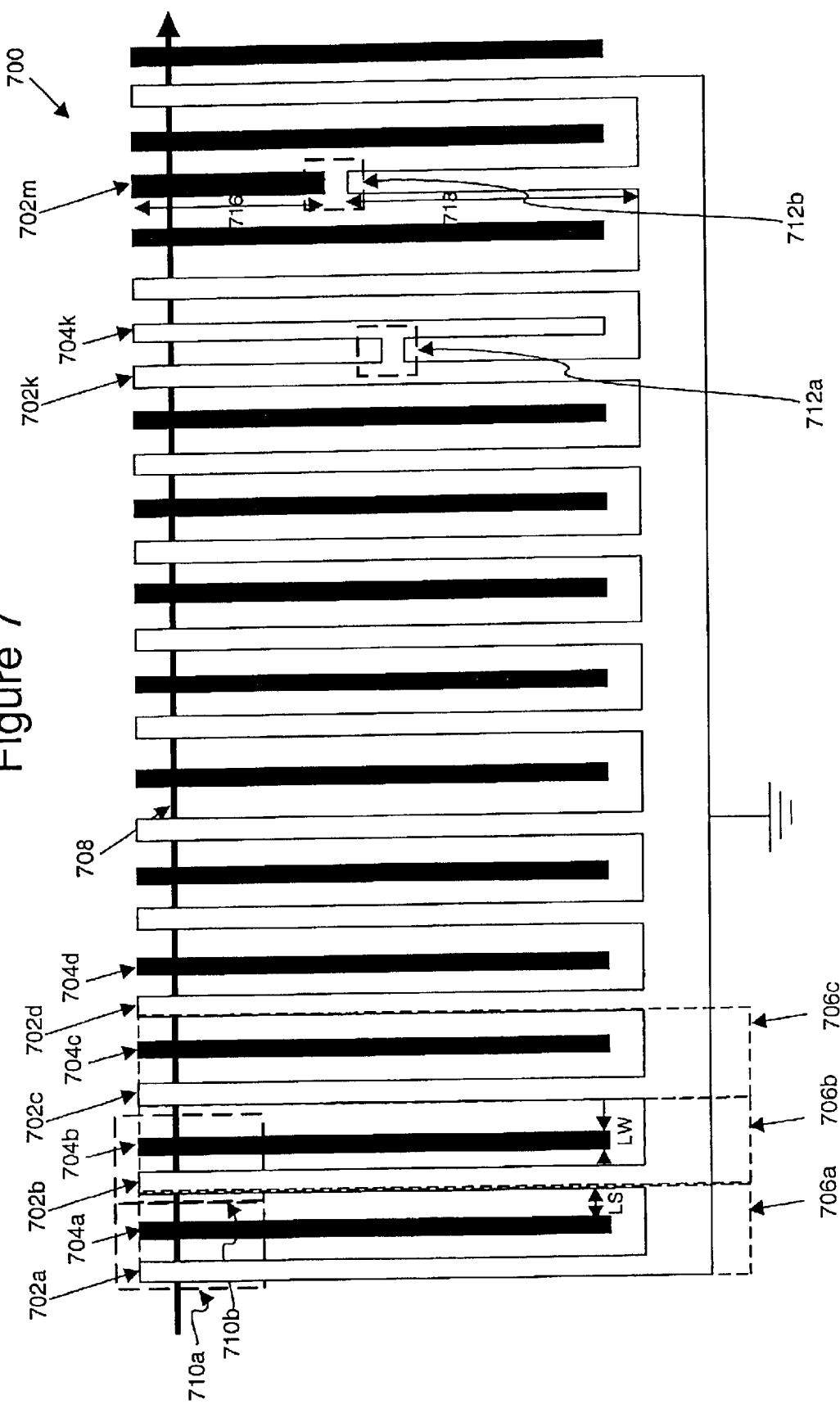
FIG. 7 is a diagrammatic top view representation of a test structure having defects from which yield parameters and product yield may be obtained.

FIG. 7 is a diagrammatic top view representation of a test structure 700 having defects in which the sampling and yield prediction techniques of the present invention may be implemented. As shown, there is an electrical short 712a between line 702k and 704k. This short 712a causes both lines 702k and 704k to appear bright. Another type of electrical defect that may occur in a test structure 700 is an open. As shown, there is an open defect 712b in line 702m. An open defect causes a portion 716 of line 702m to have a floating potential. Accordingly, the floating portion 716 will appear dark, while the portion of the line that remains coupled to ground (718) will have a bright appearance.

In sum, when two lines are shorted together, both lines will appear bright when scanned in direction 708. In contrast, when a line that is designed to be grounded contains an open, the top portion 716 of such line has the same dark appearance as its neighboring floating conductive lines when scanned in direction 708. Accordingly, when the electron beam moves in direction 708, a defect may be found when a particular cell is subtracted from another cell. For example, cell 710b may be subtracted from cell 710a. If the particular cell does not have a defect, this subtraction will ideally produce zero results. In contrast, when the particular cell has a defect, this subtraction will produce a significant difference that is then classified as defect. Electron beam tool parameter settings determine the percentage difference between the two cells that will be classified as a defect. The parameter settings may be experimentally determined and adjusted, for example, on a sample having a known number of defects.

The test structure may contain electrical defects, as well as physical defects. The physical defects may take any form, such as bumps along the edge of the line, indentations along the edge of the line, or holes within the center of the line. Preferably, mechanisms for filtering physical defects from electrical defects are also provided. Several techniques for filtering physical defects from electrical defects are described in co-pending U.S. application Ser. No. 10/000,114 (Attorney Docket No. KLA1P038) filed on 30 Oct. 2001, entitled APPARATUS AND METHODS RELIABLE AND EFFICIENT DETECTION OF VOLTAGE CONTRAST DEFECTS, by Weiner et al., which application is incorporated herein by reference in its entirety.

Figure 1:
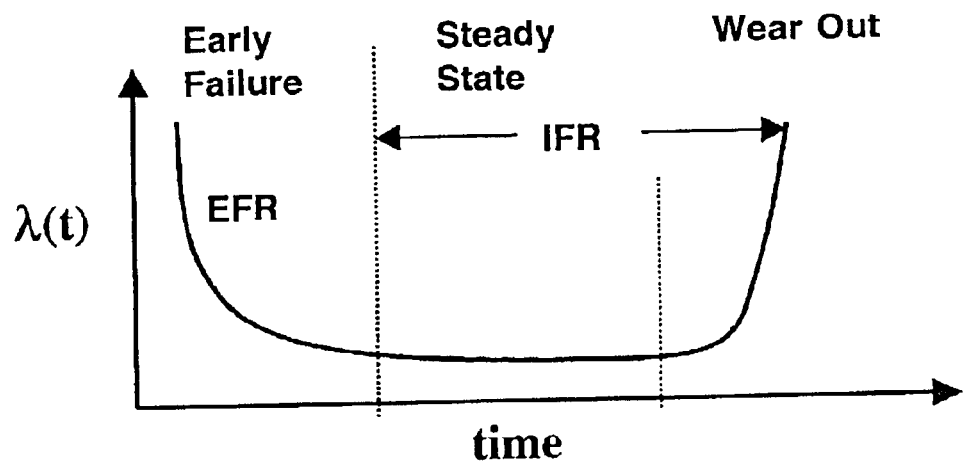
FIG. 1 is a graph of the instantaneous failure rate of a plurality of semiconductor devices as a function of time.
Figure 9:
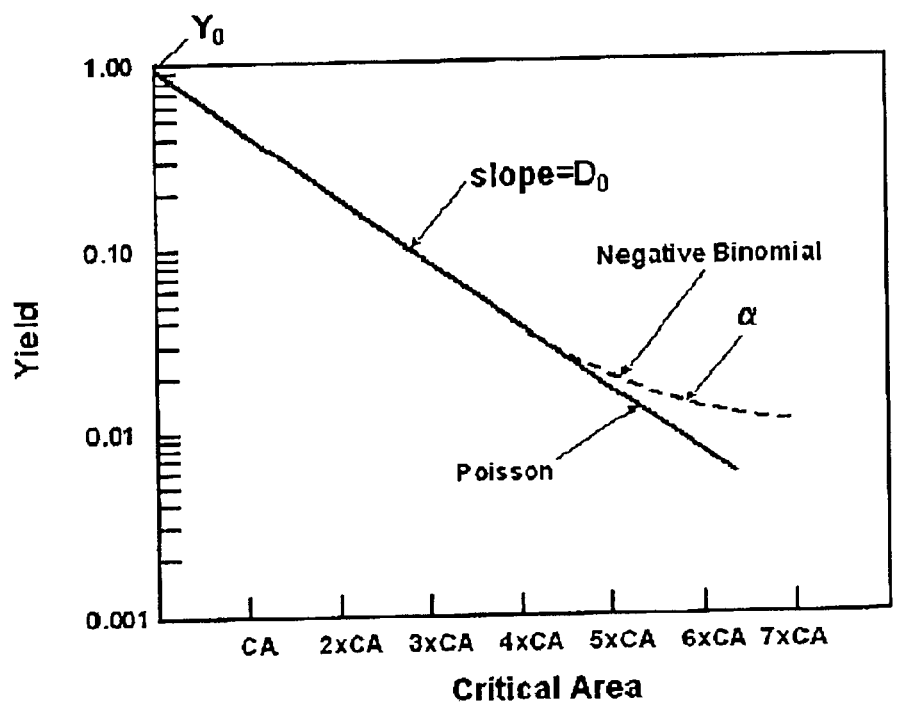
FIG. 9 is an illustration of a window-like analysis techniques for extracting yield parameters from the test structure yield.
Figure 8:
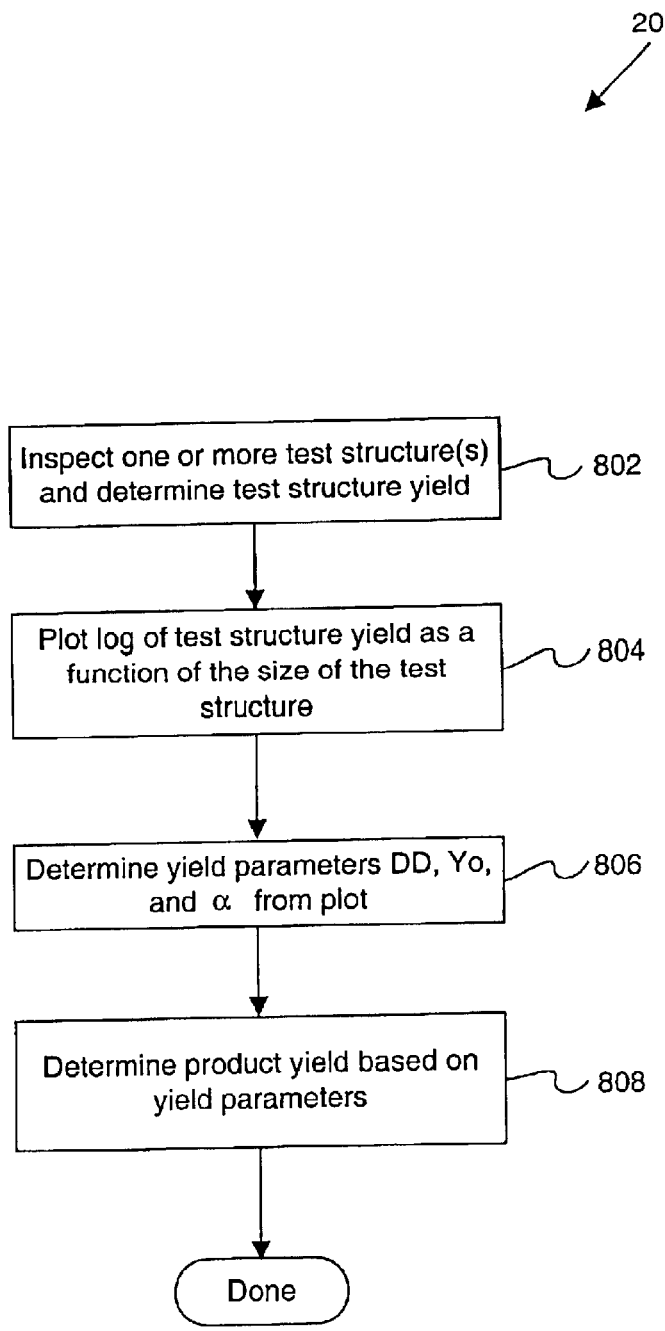
FIG. 8 is a flowchart illustrating the operation of FIG. 2 for inspecting one or more test structures to extract yield parameters and to predict product yield in accordance with one embodiment of the present invention.

FIG. 8 is a flowchart illustrating the operation 204 of FIG. 2 of inspecting one or more test structures to extract yield parameters and thereby predict product yield in accordance with one embodiment of the present invention. Initially, one or more test structures are inspected to determine test structures yield in operation 802. A log of the test structures yield is then plotted as a function of the size of the test structure in operation 804 as shown in FIG. 9, for example. The yield parameters are then determined from the test structure yield plot in operation 806.

By plotting yield vs. size (or multiples of critical area), the yield parameters or components can be extracted using a non-linear regression analysis, which is referred herein as a "window-like analysis." In the window-like analysis, the wafer (or die) is partitioned into equal areas called windows. The yields of the windows, 1, 2, 3, . . . at a time are plotted against the critical areas of the different window-groups (FIG. 9). For example, $$\ln Y = \ln Y_0 - \alpha \ln(1 + D_0 * CA/\alpha)$$

Yield models are empirical in nature and depend heavily on the nature of the defects. Any systematic defects are assumed to be fixable with the right process change, and any remaining systematic or gross-defect limited yields are measurable by the intercept at the $0^{th}$ Window. For randomly distributed defects, the yield can be described by a Poisson function:

$$Y = Y_0 e^{-\lambda} \qquad [1]$$

where $Y_0$ is the systematic yield component, which is independent of the test structure area, and $\lambda$ is the faults per chip. The faults per chip ($\lambda$) is formulated as a function of critical area CA and defect density $D_0$ (also referred herein as DD).

$$\lambda = CA * D_0 \qquad [2]$$

The Poisson yield model is derived from the binomial distribution. This model assumes no defect has any effect on any other defect, and ignores non-uniformity in defect density $D_0$. While the use of the Poisson model assumes defects have an equal probability of appearing on any die.

For clustered defects, yield can be described by negative Binomial function:

$$Y = Y_0(1 + \lambda/\alpha)^{-\alpha} \qquad [3]$$

where $\alpha$ is the cluster factor: $\alpha = (\mu/\sigma)^2$, where $\mu$ is the mean and $\sigma$ is the standard deviation of the defect density.

The systematic yield component $Y_0$ may be determined from the intercept and the defect density $D_0$ may be determined from the slope of the lnY vs. critical area curve of FIG. 9. Unlike the Poisson yield model, which assumes an uniformly random defect distribution, the Negative Binomial model takes account of defect clustering. The curvature that deviates from a straight line in the lnY vs. critical area plot represents the clustering factor $\alpha$.

The product yield may then be determined based on the yield parameters in operation 808. For example the above Poison or Binomial function may be used to determine product yield. That is, the extracted parameters are plugged into either the Poison or Binomial yield function, along with the critical area for the product. The critical area for the product may be determined using any of the above described critical area determination techniques on the product layout.

Fault density is defined as the product of the critical area and the defect density. It represents the number of failures per unit area for a given defect density. The yield of a chip is zero if there is one or more faults. Typically for a given set of defect, some of them will cause a complete open or short that kills the chip, and the probability is proportional to the critical area of the open or short defect. However, some of the defects in the same set are also likely to cause a partial open or a partial short, and the probability is proportional to the critical area of the reliability defect. The product of the critical area for reliability defect and the defect density is called the reliability fault density, and it represents the number of partial or latent failures per unit area. The reliability fault density is different for different degree of partial opens or partial shorts.

Regardless of the degree of partial opens or partial shorts, these latent defects will contribute to the early failure, and only the time to fail will be different. The instantaneous failure rate can be calculated if the reliability fault density for different degree of partial open or partial shorts and time to fail associated with different degree of partial open or partial shorts are known. Time to fail information can be determined empirically using test structures with partial defect designed in or theoretically using well known equations for different reliability failure mechanisms considering the existence of the partial defects.

After the reliability fault density has been determined, one may then use models which relate yield to instantaneous failure rate. These models were previously developed for other purposes, and not for predicting a reliability instantaneous failure rate by combining the time to fail information as in the present invention. For instance, yield-reliability models were used to reduce the critical area for both yield and reliability faults to thereby improve yield and reliability. In the present invention, yield-reliability models have been developed for various reliability failure mechanisms. The purpose of each yield reliability model is to establish a relationship between the earlier failure rate and the defect density and yield information at time zero, corresponding to specific reliability mechanisms of the semiconductor product. After the establishment of such a relationship, the earlier failure rate can be effectively predicted. Burn-in can then the reduced or eliminated.

A yield-reliability model may be developed for any suitable early failure mechanisms. The development of yield-reliability models for three major reliability failure mechanisms are illustrated herein. Of course, one skilled in the art may easily extend these illustrated model development techniques to other types of failure mechanisms as needed. The first mechanism described herein is electromigration of Al or Cu interconnects, an atomic transport phenomena caused by electron "wind". Although Cu is about 30 times or more E-M Resistant than Al, but it is not immune to early fails due to partial defects. In the Cu electromigration case, the partial opens are assumed to be caused by random defects, and systematic issues such as void formation inside a via due to improper electro-chemical plating conditions, or poor adhesions at the via bottom, or stress gradient due to improper annealing conditions, are solved. The second mechanism is the gate oxide breakdown, which can be caused by either carrier injection or Fowler-Nordheim tunneling. In this mechanism, the local oxide thinning due to random defects are considered. The third mechanism is the hot carrier effect which includes electron-hole pair generation due to impact ionization near high electric field near the drain area of a transistor.

Electromigration Yield-Reliability Model Development

Electromigration is the self-diffusion of metal in a preferred direction due to momentum transfer from electron flowing in the line. The rate of electromigration is a function of the current density and the temperature of the film for any given material. This dependency is generally expressed in what is known as Black's equation:

$$t = aj^{-n}\exp\left(\frac{E_B}{kT}\right) \quad [4]$$

where j is the current density, $E_B$ is the activation energy, and T is the temperature. n=2 has been reported for plated Cu under current density below $10^7$ A/cm$^2$, and n=9 for current density above $10^7$ A/cm$^2$, and $E_B$ is about 0.8 eV.

Electromigration information can be obtained microscopically using a numerical approach by solving Laplace equation for current distribution and mass transport for vacancy flux. It can also be described theoretical using Shatzkes and Lloyd's equation.

$$t = BT^2 j^{-2}\exp\left(\frac{E_B}{kT}\right) \quad [5]$$

Reliability fault density can be defined as:

$$\lambda_{rel} = DD \times CA_{rel} \quad [6]$$

where DD is yield defect density, and $CA_{rel}$ is the critical area for reliability defects. Instantaneous failure rate is then obtained from the reliability fault density:

$$\lambda(t) = \frac{f(t)}{1-F(t)} = -\frac{d\ln(1-F(t))}{dt} = \frac{d\lambda_{rel}}{dt} \quad [7]$$

If one assumes that the defect density does not change and it can be evaluated from the yield information at time zero, the DD may be obtained by:

$$DD = -\ln\left(\frac{Y}{Y_0}\right) \times \frac{1}{CA_0} \quad [8]$$

Then instantaneous failure rate $$\lambda(t) = \frac{d\lambda_{rel}}{dt} = \frac{d}{dt}(DD \times CA_{rel}) = \frac{d}{dt}\left(-\ln\left(\frac{Y}{Y_0}\right) \times \frac{CA_{rel}}{CA_0}\right) \quad [9]$$

The critical area for reliability defects can be extracted precisely using critical area calculation software, as described previously. A simple relationship may be assumed to illustrate the procedure of the calculation of the instantaneous failure rate. For example, it is assumed that the ratio of the critical area for reliability defects and yield defects is a linear function of the remaining line width.

$$CA_{rel}/CA_0 = w/W_0 \quad [10]$$

where w is the remaining line width. When the remaining line width is small, the time to fail will be less. Using Black's equation for electromigration time to fail as a function of the remaining line width, and ignoring the heating caused by the current crowding so that the temperature is a constant, the time to fail is:

$$t = aj^{-2}\exp\left(\frac{E_B}{kT}\right) = a\frac{w^2}{I^2}\exp\left(\frac{E_B}{kT}\right) \quad [11]$$

Then $$w = aj^{-2}\exp\left(\frac{E_B}{kT}\right) = bI\sqrt{t}\exp\left(\frac{E_B}{kT}\right) \quad [12]$$

Instantaneous failure rate is then the inverse proportional to the square root of time:

$$\lambda(t) = \text{const} \times \ln\left(\frac{Y}{Y_0}\right) \times \frac{1}{\sqrt{t}} \quad [13]$$

Here the instantaneous rate is just a simple function inversely proportional to the square root of time. Of course, a more precise ratio of critical area for reliability defects and yield defects for different remaining line width can be used, and different forms of time to fail, even an empirical relationship can be used for time to fail for different remaining line width. The procedure for the instantaneous failure rate calculation is still the same for these alternative embodiments.

Statistics may also be incorporated into the analysis. Consider a given metal line width $w_0$, with a partial defect, and the remaining line width is w. For these parameters, the distribution of w is n(w):

$$\int_0^{w0} n(w)dw = 1 \quad [14]$$

The critical area for a reliability defect that causes a partial open is the area of a given design in which a defect with certain size distribution (convoluted in the critical area calculation) falls and a partial open with remaining line width (w) occurs.

The value of the critical area for a reliability defect that causes a partial open with remaining line width of w is, therefore, the probability of a finding a remaining line width of w for a given design after the random defects occur. The distribution of the critical area for reliability defects that causes partial opens with different remaining line width is therefore the distribution function of w $$n(w) = \frac{POF_{rel}(w)}{\int_0^{w0} POF_{rel}(w)dw} \quad [15]$$

From Black's equation (assuming n=2), the mean time to failure is:

$$\ln t_w = \ln a - 2\ln j(w) + \frac{E_B}{kT(w)} \quad [16]$$

The probability that the metal line opens between time t and t+dt is:

$$f_w(t)dt = \frac{1}{t\sigma(w)\sqrt{2\pi}} \exp\left[-\frac{1}{2}\frac{(\ln t - \ln t_w)^2}{\sigma^2(w)}\right] \quad [17]$$

where $t_w$ is the mean and $\sigma$ is the variation. The mean time to fail ($T_{50\%}$) is less for smaller line width than that for a larger line width. For a given design with different line widths, the probability of open is a distributions of many fail probabilities corresponding to the histogram of line width n(w). However random defects further complicate the line width distribution, since they can cause partial opens that reduce the remaining line width. In this case, line width distribution calculated using the critical area for reliability defects will be used. Substitution of the distribution of w yields:

$$f(t) = \int_{w=0}^{w=w0} \frac{n(w)}{t\sigma(w)\sqrt{2\pi}} \exp\left[-\frac{1}{2}\frac{(\ln t - \ln t_w)^2}{\sigma^2(w)}\right] dw \quad [18]$$

The product of remaining line width distribution and the intrinsic probability of line open gives the weighted probability of a partial line open for a particular design. Because the current density j(w) is proportional to 1/w, assuming T(w)=T, $\sigma(w)=\sigma$; then $$f(t) = \int_{w=0}^{w=w0} \frac{n(w)}{t\sigma\sqrt{2\pi}} \exp\left[-\frac{1}{2}\frac{(\ln t - \ln a + 2\ln(b/w) - E_B/kT)}{\sigma^2}\right] dw \quad [19]$$

Here a and b are constants. The instantaneous failure rate can then be obtained from the probability density function:

$$\lambda(t) = \frac{f(t)}{1 - F(t)} \quad [20]$$

where f(t) is the fail probability, and F(t) is the accumulative failure rate.

Gate Oxide Breakdown Yield-Reliability Model Development

Thin dielectric films used for the gate oxide can be exposed to high electric fields, which can cause a breakdown of the dielectric material over time. This breakdown is also called time dependent dielectric breakdown [TDDB]. Most of the reliability issues are associated with defects such as small point defects, which are often located at the edge of field oxide, the edge of the poly lines, or randomly distributed across the area of the oxide. The defects in the gate oxide generally concentrate the electric field in a very small area, leading to tunneling currents at lower voltage than would be expected for a defect free dielectric. This tunneling current is referred to as the Fowler-Nordheim tunneling current and can be described by following equation $$J_{FN} = AE_{ox}\exp\left(-\frac{B}{E_{ox}}\right) \quad [21]$$

where A and B are constants, $E_{ox}$ is the electric field inside the gate oxide. Tunneling current increases as the electric field increases. Time Dependent Dielectric Breakdown (TDDB) for gate oxide can be expressed as follow $$t_{BD} = \tau_0(T)\exp\left(\frac{G(T)}{E_{ox}}\right) = \tau_0(T)\exp\left(\frac{G(T)(t_{ox} - \Delta t_{ox})}{V_{ox}}\right) \quad [22]$$

Here $\tau_0(T)$ is a constant function of temperature T, $t_{ox}$ and $\Delta t_{ox}$ are the oxide thickness and its variation, and $V_{ox}$ is the voltage across the oxide. G(T) is another constant is equals to 350 MV/m.

Time to fail for gate oxide breakdown is a function of the oxide thickness. That is, the thinner the oxide, the sooner the breakdown under the same electric field stress. The probability of the breakdown time for a certain oxide thickness less than that of another oxide thickness is $$P(t_{BD}' < t_{BD}) = P(\Delta t_{ox}' > \Delta t_{ox}) = 1 - \exp(-AD(\Delta t_{ox})) \quad [23]$$

Here A is the gate oxide area, and D is the defect (oxide thinning) density. Therefore the cumulative distribution function is $$F(t) = 1 - \exp(-AD(\Delta t_{ox})) \quad [24]$$

Instantaneous failure rate is $$\lambda(t) = -\frac{d\ln(1 - F(t))}{dt} = \frac{Ad(D(\Delta t_{ox}))}{dt} = \frac{AD(\Delta t_{ox})d\Delta t_{ox}}{dt} \quad [25]$$

Using TDDB equation, the instantaneous failure rate is then a function of time:

$$\lambda(t) = AD(\Delta t_o)\frac{V}{Gt} = -\ln\left(\frac{Y}{Y_0}\right)\frac{V}{G}\frac{1}{t} \quad [26]$$

Here Y is the yield at time zero and $Y_0$ is the systematic yield at time zero.

Of course, the same procedure can be applied using different empirical or theoretical equations which describe time to fail as a function of gate oxide thickness and defect densities. For example, the time dependent dielectric breakdown can also be determined experimentally using a ramp voltage breakdown test on test structures. First a cumulative percentage of failures versus breakdown voltage $V_{BD}$ for different oxide thickness $t_{oxeff}$ is obtained, then the correlation between cumulative percentage of failures versus $t_{oxeff}$, and subsequently the relationship between defect density function and time to fail can be established.

The same statistical calculations can be performed similarly as discussed in the previous section.

Hot Carrier Injection Yield-Reliability Model Development

Hot carrier generated by the high field at the edge of the drain of a short-channel transistor can be injected into the gate oxide due to the presence of the gate field which is also present near the edge of the drain. Some of these hot carriers can be trapped in the gate oxide, or cause damage to the interface between the oxide and the silicon. These trapped charges can cause a significant change in the transconductance, drive current, or threshold voltage of the stressed transistor. Electric field near the drain edge can be expressed as:

$$E_{max} = \frac{V_{DS} - V_{DSSAT}}{l}, V_{DSSAT} = \frac{E_{sat}L(V_{GS} - V_T)}{(V_{GS} - V_T) + E_{sat}L}, l = at_{ox}^{1/3}r_j^{1/3} \quad [27]$$

where $t_{ox}$ is the gate oxide thickness, and $r_j$ is the source/drain junction depth. Substrate current is:

$$I_{sub} = a(V_{DS} - V_{DSSAT})I_D \exp\left(\frac{b}{E_{max}}\right) \quad [28]$$

Time to fail due to hot carrier injection can be generally expressed as:

$$\tau = BZ \frac{I_{sub}^{-m}}{I_D^{m-1}} \quad [29]$$

Or specifically:

$$t = 3\left(\frac{I_{sub}}{I_D}\right)^{-3} = 3 \quad [30]$$

$$\left(\frac{1.2(V_{DS} - V_{DSSAT})I_D \exp(-3.7 \times 10^5 t_{ox}^{1/3} r_j^{1/3} / (V_{DS} - V_{DSSAT}))}{I_D}\right)^{-3}$$

and $$\ln t = a + b(t_{ox} - \Delta t_{ox})^{1/3} \quad [31]$$

The cumulative distribution function for hot carrier injection is:

$$F(t) = 1 - \exp(-AD(\Delta t_{ox})) \quad [32]$$

Instantaneous failure rate is then:

$$\lambda(t) = \frac{-AD(\Delta t_{ox}) d\Delta t_{ox}}{dt} = -a \ln\left(\frac{Y}{Y_0}\right) \frac{(b - \ln t)^2}{t} \quad [33]$$

Again, the same procedure still applies for different empirical or theoretical relationships between time to fail and defect densities. The same statistical calculations can be performed similarly as discussed in the previous section.

The total instantaneous failure rate for different reliability failure mechanisms including electromigration, gate oxide breakdown and hot carrier injection can be summarized as $$\lambda(t) = -\left(\ln\left(\frac{Y_1}{Y_0}\right)\frac{a_1}{\sqrt{t}} + \ln\left(\frac{Y_2}{Y_0}\right)\frac{a_2}{t} + \ln\left(\frac{Y_3}{Y_0}\right)\frac{a_3(a_4 - \ln t)^2}{t}\right) \quad [34]$$

where $a_1$ are constants and $Y_i$ is the yield for various mechanisms.

Generally, the techniques of the present invention for managing reliability may be implemented on software and/or hardware. For example, these techniques can be implemented in an operating system kernel, in a separate user process, in a library package bound into inspection applications, or on a specially constructed machine, such as an optical or scanning electron microscopy inspection system available from KLA-Tencor of San Jose, Calif. In a specific embodiment of this invention, some of the techniques of the present invention are implemented in software such as an operating system or in an application running on an operating system. A software or software/hardware hybrid critical area determination system of this invention may be implemented on a general-purpose programmable machine selectively activated or reconfigured by a computer program stored in memory.

Figure 10:
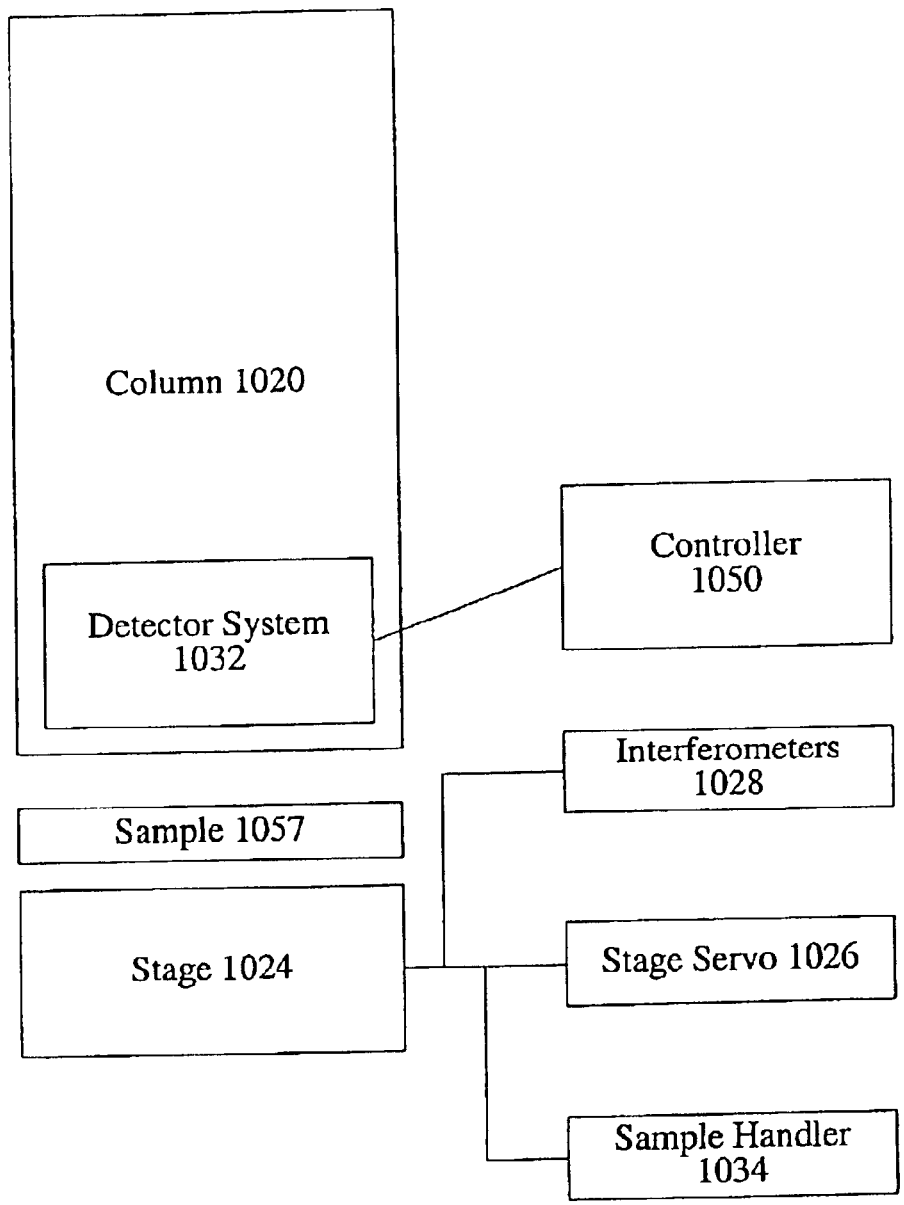
FIG. 10 is a diagrammatic representation of a system in which the techniques of the present invention may be implemented.

The techniques for determining whether to burn-in may be implemented within an inspection tool for inspecting test structures or a test tool for performing the actual burn-in procedure. In the later case, the yield results obtained from the inspection tool are provided to the test tool. In either embodiment, the techniques are generally implemented by a processor and/or memory within a computer system, which may form part of the inspection or test tool. By way of an example implementation, FIG. 10 is a diagrammatic representation of a scanning electron microscope (SEM) system in which the techniques of the present invention may be implemented. The detail in FIG. 10 is provided for illustrative purposes. One skilled in the art would understand that variations to the system shown in FIG. 10 fall within the scope of the present invention. For example, FIG. 10 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 can be configured to have six degrees of freedom including movement and rotation along the x-axis, y-axis, and z-axis. In a preferred embodiment, the stage 1024 is aligned relative to the particle beam 1020 so that the x-directional motion of the stage is corresponds to an axis that is perpendicular to a longitudinal axis of inspected conductive lines. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. Alternatively, a relatively wide electron beam may be utilized without scanning the beam relative to the sample. According to a preferred embodiment, the stage 1024 is grounded to thereby ground the substrate and any structure tied to the substrate (e.g., grounded test structure conductive lines) to allow voltage contrast between the floating and grounded structures as the result of scanning the targeted features.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the reliability management, critical area determination and yield prediction techniques of the present invention. The controller may also be configured to correlate the coordinates of the electron beam with respect to the sample with coordinates on the sample to thereby determine, for example, a location of a determined electrical defect. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, test structure characteristics (e.g., line width and spacing values), critical boundary information, critical area or radius values, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of determining whether to perform burn-in a semiconductor product, comprising:

for the semiconductor product, determining a time to fail for one or more failure mechanisms prior to performing any burn-in procedure on such semiconductor product;

for the semiconductor product, an instantaneous failure rate for the one or more failure mechanisms based on the determined time to fail for the one or more failure mechanisms and yield information obtained from the semiconductor product prior to performing any burn-in procedure on such semiconductor product;

invoking a burn-in procedure on the semiconductor product when the determined instantaneous failure rate for such semiconductor product is not within a predetermined specification bound; and skipping the burn-in procedure when the determined instantaneous failure rate for such semiconductor product is within the predetermined specification bound.

2. A method as recited in claim 1, wherein the semiconductor product is a semiconductor product wafer.

3. A method as recited in claim 1, wherein the semiconductor product is a semiconductor product wafer lot.

4. A method as recited in claim 1, wherein the determination of the instantaneous failure rate is based indirectly on the yield information and such determination comprises:

for the semiconductor product, determining a critical area for reliability failure;

inspecting one or more test structures on the semiconductor product to determine yield information for the semiconductor product lot immediately after fabrication;

determining a reliability fault density for reliability defects in the semiconductor product based on the determined yield information and the determined critical area for reliability failure; and for the semiconductor product, determining an instantaneous failure rate for the one or more failure mechanisms based on the determined time to failure for the one or more failure mechanisms.

5. A method as recited in claim 1, wherein the one or more failure mechanisms are selected from a group consisting of electromigration, gate oxide breakdown, and hot carrier injection.

6. A method as recited in claim 4, wherein determining the critical area for reliability failure comprises:

determining a probability of failure function for yield of the semiconductor product;

providing a defect size distribution for the semiconductor product;

determining a critical area for yield for the semiconductor product based on the determined probability of failure function for yield and the defect size distribution for the semiconductor product;

determining a probability of failure function for yield plus reliability;

determining a critical area for yield plus reliability from the probability of failure function for yield plus reliability; and determining the critical area for reliability by subtracting the critical area for yield from the critical yield for yield plus reliability.

7. A method as recited in claim 4, wherein inspecting one or more test structures on the semiconductor product to determine yield information for the semiconductor product lot immediately after fabrication comprises:

inspecting the one or more test structures to determine test structure yield;

determining a log of test structure yield as a function of a size of the one or more test structures; and determining a defect density, systematic yield, and a alpha curvature or defect cluster parameter from the log of test structure yield as a function of the size.

8. A method as recited in claim 6, wherein the determination of the probability of fail function for yield plus reliability comprises shifting a curve of the probability of fail function for yield as a function of defect size to a reliability defect size that will cause a reliability fault.

9. A computer program product for determining whether to perform burn-in a semiconductor product, the computer program product comprising:

at least one computer readable medium;

computer program instructions stored within the at least one computer readable product configured to:

for the semiconductor product, determine a time to fail for one or more failure mechanisms prior to performing any burn-in procedure on such semiconductor product;

for the semiconductor product, determine an instantaneous failure rate for the one or more failure mechanisms based on the determined time to fail for the one or more failure mechanisms and yield information obtained from the semiconductor product prior to performing any burn-in procedure on such semiconductor product;

determine to perform a burn-in procedure on the semiconductor product when the determined instantaneous failure rate for such semiconductor product is not within a predetermined specification bound; and determine to skip the burn-in procedure when the determined instantaneous failure rate for such semiconductor product is within the predetermined specification bound.

10. A computer program product as recited in claim 9, wherein the determination of the instantaneous failure rate is based indirectly on the yield information and such determination comprises:

for the semiconductor product, determining a critical area for reliability failure;

providing yield results from inspecting one or more test structures on the semiconductor product and using the yield results to determine yield information for the semiconductor product lot immediately after fabrication;

determining a reliability fault density for reliability defects in the semiconductor product based on the determined yield information and the determined critical area for reliability failure; and for the semiconductor product, determining an instantaneous failure rate for the one or more failure mechanisms based on the determined time to failure for the one or more failure mechanisms.

11. A computer program product as recited in claim 10, wherein determining the critical area for reliability failure comprises:

determining a probability of failure function for yield of the semiconductor product;

providing a defect size distribution for the semiconductor product;

determining a critical area for yield for the semiconductor product based on the determined probability of failure function for yield and the defect size distribution for the semiconductor product;

determining a probability of failure function for yield plus reliability;

determining a critical area for yield plus reliability from the probability of failure function for yield plus reliability; and determining the critical area for reliability by subtracting the critical area for yield from the critical yield for yield plus reliability.

12. A computer program product as recited in claim 11, wherein the determination of the probability of fail function for yield plus reliability comprises shifting a curve of the probability of fail function for yield as a function of defect size to a reliability defect size that will cause a reliability fault.

13. A computer system for determining whether to perform burn-in on such semiconductor product, the system comprising a processor and at least one memory operable to:

for the semiconductor product, determine a time to fail for one or more failure mechanisms prior to performing any burn-in procedure on such semiconductor product;

for the semiconductor product, determine an instantaneous failure rate for the one or more failure mechanisms based on the determined time to fail for the one or more failure mechanisms and yield information provided from inspection of such semiconductor product prior to performing any burn-in procedure on such semiconductor product;

determine to perform a burn-in procedure on the semiconductor product when the determined instantaneous failure rate for such semiconductor product is within a predetermined specification; and determine to skip the burn-in procedure when the determined instantaneous failure rate for such semiconductor product is not within the predetermined specification.

14. A computer system as recited in claim 13, wherein the determination of the instantaneous failure rate is based indirectly on the yield information and such determination comprises:

for the semiconductor product, determining a critical area for reliability failure;

providing yield results from inspecting one or more test structures on the semiconductor product and using the yield results to determine yield information for the semiconductor product lot immediately after fabrication;

determining a reliability fault density for reliability defects in the semiconductor product based on the determined yield information and the determined critical area for reliability failure; and for the semiconductor product, determining an instantaneous failure rate for the one or more failure mechanisms based on the determined time to failure for the one or more failure mechanisms.

15. A computer system as recited in claim 14, wherein determining the critical area for reliability failure comprises:

determining a probability of failure function for yield of the semiconductor product;

providing a defect size distribution for the semiconductor product;

determining a critical area for yield for the semiconductor product based on the determined probability of failure function for yield and the defect size distribution for the semiconductor product;

determining a probability of failure function for yield plus reliability;

determining a critical area for yield plus reliability from the probability of failure function for yield plus reliability; and determining the critical area for reliability by subtracting the critical area for yield from the critical yield for yield plus reliability.

16. A computer system as recited in claim 15, wherein the determination of the probability of fail function for yield plus reliability comprises shifting a curve of the probability of fail function for yield as a function of defect size to a minimum reliability defect size that will cause a reliability fault.

* * * * *

UNITED STATES PATENT AND TRADEMARK OFFICE
CERTIFICATE OF CORRECTION

PATENT NO.       : 6,813,572 B2
APPLICATION NO. : 10/281432
DATED            : November 2, 2004
INVENTOR(S)      : Satya et al.

It is certified that error appears in the above-identified patent and that said Letters Patent is hereby corrected as shown below:

In the Specifications:

Column 7, line 1, add --for (506) < X < [2*(506) + (504)], and-- after

"$P\{X\} = \dfrac{X - S}{W + S}$".

Column 12, line 10, change "$w = aj^{-2} \exp\left(\dfrac{E_B}{kT}\right) = bI\sqrt{t} \exp\left(\dfrac{E_B}{kT}\right)$"

to --$w = aj^{-2}\left(-\dfrac{E_B}{kT}\right) = bI\sqrt{t}\left(\dfrac{E_B}{kT}\right) \exp \exp$ --.

Column 13, line 31, change "$f(t) = \displaystyle\int_{w=0}^{w=w_0} \dfrac{n(w)}{t\sigma\sqrt{2\pi}} \exp\left[-\dfrac{1}{2}\dfrac{(\ln t - \ln a + 2\ln(b/w) - E_a/kT)}{\sigma^2}\right] dw$"

to -- $f(t) = \displaystyle\int_{w=0}^{w=w_0} \dfrac{n(w)}{t\sigma\sqrt{2\pi}} \exp\left[-\dfrac{1}{2}\dfrac{(\ln t - \ln a + 2\ln(b/w) - E_a/kT)^2}{\sigma^2}\right] dw$ --.

Column 14, line 32, change "$\lambda(t) = AD(\Delta t_o) \dfrac{V}{Gt} = -\ln\left(\dfrac{Y}{Y_0}\right)\dfrac{V}{G}\dfrac{1}{t}$"

to --$\lambda(t) = AD(\Delta t_{ox}) \dfrac{V}{Gt} = -\ln\left(\dfrac{Y}{Y_0}\right)\dfrac{V}{G}\dfrac{1}{t}$ --.

UNITED STATES PATENT AND TRADEMARK OFFICE
CERTIFICATE OF CORRECTION

PATENT NO. : 6,813,572 B2
APPLICATION NO. : 10/281432
DATED : November 2, 2004
INVENTOR(S) : Satya et al.

It is certified that error appears in the above-identified patent and that said Letters Patent is hereby corrected as shown below:

In the Claims:

In line 6 of claim 1 (column 17, line 39) change "an instantaneous" to --determining an instantaneous--.

Signed and Sealed this

Eighteenth Day of March, 2008

JON W. DUDAS
*Director of the United States Patent and Trademark Office*